United States Patent
Hsu et al.

(10) Patent No.: US 7,196,387 B2
(45) Date of Patent: Mar. 27, 2007

(54) MEMORY CELL WITH AN ASYMMETRICAL AREA

(75) Inventors: Sheng Teng Hsu, Camas, WA (US); Fengyan Zhang, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 56 days.

(21) Appl. No.: 11/174,034

(22) Filed: Jul. 1, 2005

(65) Prior Publication Data
US 2005/0243630 A1  Nov. 3, 2005

Related U.S. Application Data

(62) Division of application No. 10/730,726, filed on Dec. 8, 2003, now Pat. No. 6,949,435.

(51) Int. Cl.
*H01L 29/82* (2006.01)
*H01L 43/00* (2006.01)

(52) U.S. Cl. .................. 257/421; 257/295; 257/296; 257/E21; 257/645; 257/662

(58) Field of Classification Search ............... 257/421, 257/68, 295, 296, 422, 424, 427
See application file for complete search history.

(56) References Cited

U.S. PATENT DOCUMENTS

| | | | | |
|---|---|---|---|---|
| 5,835,003 A | * | 11/1998 | Nickel et al. | 338/32 R |
| 6,204,139 B1 | * | 3/2001 | Liu et al. | 438/385 |
| 6,949,435 B2 | * | 9/2005 | Hsu et al. | 438/286 |
| 7,029,924 B2 | * | 4/2006 | Hsu et al. | 438/3 |

* cited by examiner

*Primary Examiner*—David Nhu
(74) *Attorney, Agent, or Firm*—Law Office of Gerald Maliszewski; Gerald Maliszewski

(57) ABSTRACT

An asymmetric-area memory cell, and a fabrication method for forming an asymmetric-area memory cell, are provided. The method comprises: forming a bottom electrode having an area; forming a CMR memory film overlying the bottom electrode, having an asymmetric area; and, forming a top electrode having an area, less than the bottom electrode area, overlying the CMR film. In one aspect, the CMR film has a first area adjacent the top electrode and a second area, greater than the first area, adjacent the bottom electrode. Typically, the CMR film first area is approximately equal to the top electrode area, although the CMR film second area may be less than the bottom electrode area.

12 Claims, 5 Drawing Sheets

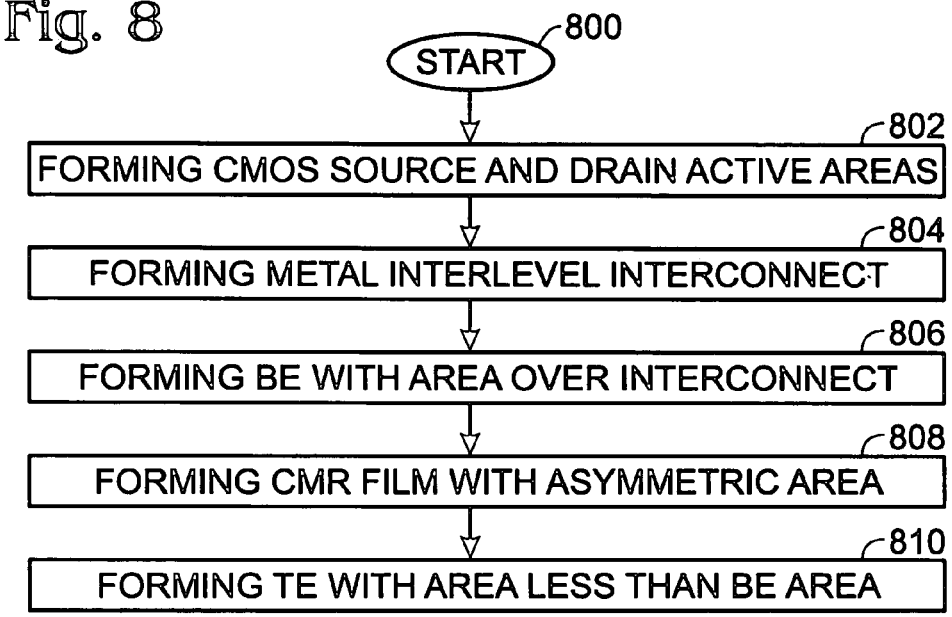
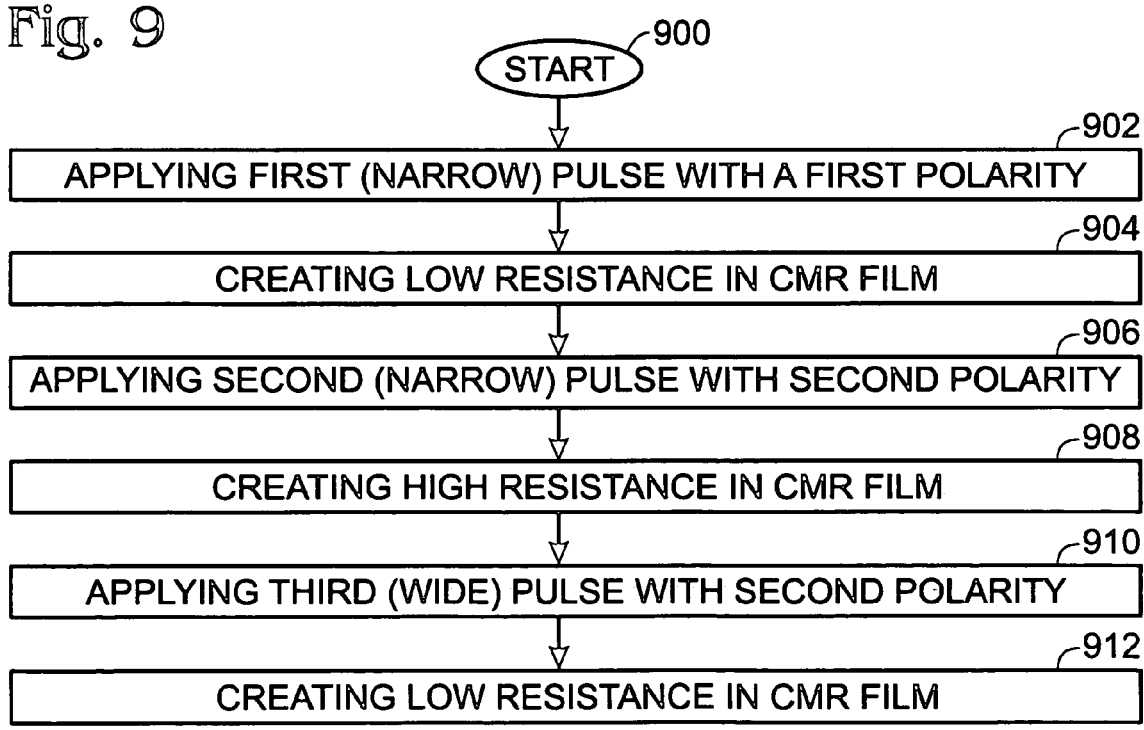

MEMORY CELL WITH AN ASYMMETRICAL AREA

RELATED APPLICATIONS

This application is a Divisional of a pending patent application entitled, ASYMMETRIC-AREA MEMORY CELL, invented by Hsu et al., Ser. No. 10/730,726, filed Dec. 8, 2003, U.S. Pat. No. 6,949,435 which is incorporated herein by reference.

BACKGROUND OF THE INVENTION

1. Field of the Invention

This invention generally relates to a thin film resistance memory device, for non-volatile memory arrays, and more particularly, to a bipolar programmable memory cell having an asymmetric area.

2. Description of the Related Art

State of the art resistor random access memories (RRAMs) are often made from a colossal magnetoresistance (CMR) memory film and, more typically, from a $Pr_{0.3}Ca_{0.7}MnO_3$ (PCMO) type of CMR material. The CMR material can be said to have a nonvolatile nature, as the resistance of the CMR material remains constant under most circumstances. However, when a high electric field induces current flow through the CMR material, a change in the CMR resistance can result. During narrow-pulse programming, the resistivity of the memory resistor near an electrode changes. Experimental data shows that the resistivity of the CMR material near the cathode increases while that at the anode decreases. During the erase process the pulse polarity is reversed. That is, the designation of cathode and anode are reversed. Then, the resistivity of the material near the cathode decreases, and the resistivity near the anode increases.

FIG. 1 is a diagram of a symmetrical CMR film memory cell (prior art). The device is called symmetric because it has a uniform area along any cross-section of the CMR film thickness. The memory cell can be written to high-resistance state using either positive or negative narrow pulse, and reset to low-resistance state using a long-width electrical pulse. Other memory cells (not shown) may be written to high-resistance state and erased to low-resistance state using a narrow negative pulse and a narrow positive pulse, respectively. A memory device that is responsive to only one type of programming, either bipolar or uni-polar, has a necessarily limited usefulness, and is dependent upon system specifications and available power supplies.

Thus, some systems are designed for bipolar programming, whereas others are designed for uni-polar programming, depending upon the type of CMR memory cell being used. This uncertainty in the design of the memory cells necessarily increases production costs. Some CMR film memory cell designs are made bipolar programmable by manipulating the composition of the film along the thickness of the RRAM resistor. As the memory cell size is reduced, the thickness of the memory resistor thin film is also reduced. However, CMR film thickness can be a difficult variable to control.

It would be advantageous if a CMR memory cell could be programmed using bipolar, as well a uni-polar pulses.

It would be advantageous if a process for fabricating a CMR memory cell that is responsive to either bipolar or unipolar programming, could be made scalable for processes using increasing smaller feature sizes.

SUMMARY OF THE INVENTION

The present invention provides a CMR memory device structure that can be reliably programmed using a bipolar pulse programming process. Alternately, the device can be programmed using a uni-polar pulse programming process. The flexibility in programming is a result of the device's unique asymmetric-area design.

Accordingly, a method is provided for forming an asymmetric-area memory cell. The method comprises: forming a bottom electrode having an area; forming a CMR memory film overlying the bottom electrode, having an asymmetric area; and, forming a top electrode having an area, less than the bottom electrode area, overlying the CMR film. In one aspect, the CMR film has a first area adjacent the top electrode and a second area, greater than the first area, adjacent the bottom electrode. Typically, the CMR film first area is approximately equal to the top electrode area, although the CMR film second area may be less than the bottom electrode area.

More specifically, the method comprises: isotropically depositing a bottom electrode layer; isotropically depositing a CMR film layer, having a first thickness, overlying the bottom electrode layer; and, isotropically depositing a top electrode layer overlying the CMR film layer. Then, the top electrode layer and a second thickness portion of the CMR film layer are etched to form the top electrode area and the CMR film first area. A first set of sidewall insulators is formed adjacent the top electrode and the second thickness portion of the CMR film. Then, the CMR film second area is formed by etching the remaining portion of the CMR film layer, leaving a third thickness portion of the CMR film second area underlying the first set of sidewall insulators, where the third thickness is equal to the first thickness minus the second thickness.

A second set of sidewall insulators is formed overlaying the first set of sidewall insulators and adjacent the third thickness portion of the CMR film. Then, the bottom electrode layer is etched, leaving a bottom electrode area underlying the first and second set of sidewall insulators.

Additional details of the above-described method, a method for programming an asymmetric-area memory cell using either bipolar or uni-polar pulses, an asymmetric-area memory cell device, and an asymmetric-area RRAM are provided below.

BRIEF DESCRIPTION OF THE DRAWINGS

FIG. 8 is a flowchart illustrating the present invention method for forming an RRAM asymmetric-area memory cell.

FIG. 9 is a flowchart illustrating the present invention method for programming an asymmetric-area memory cell using bipolar and uni-polar pulses.

DETAILED DESCRIPTION OF THE PREFERRED EMBODIMENTS

Figure 1:
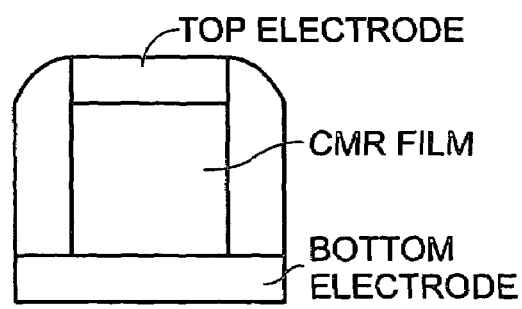
FIG. 1 is a diagram of a symmetrical CMR film memory cell (prior art).
Figure 2:
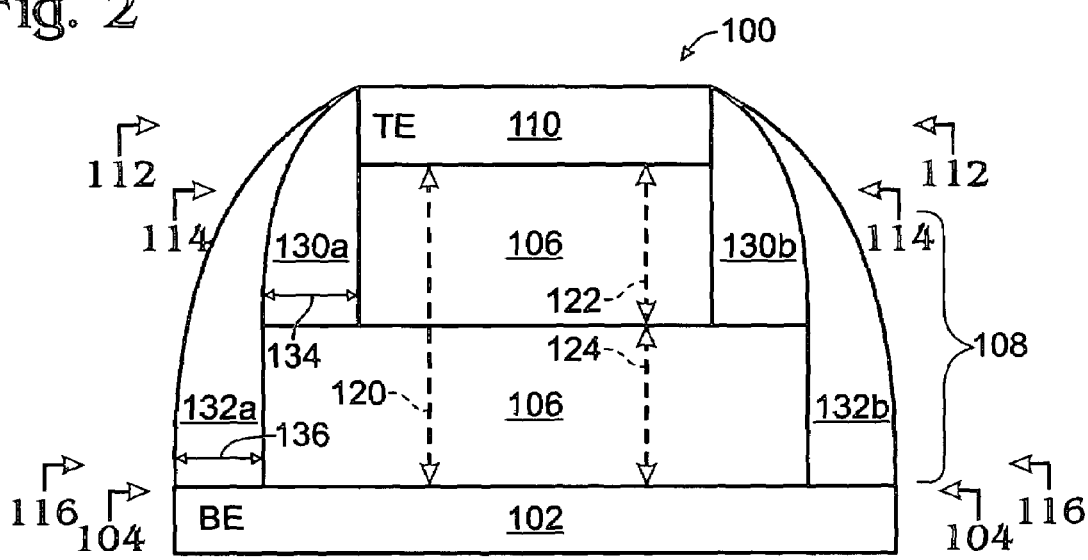
FIG. 2 is a diagram illustrating the present invention asymmetric-area memory cell.

FIG. 2 is a diagram illustrating the present invention asymmetric-area memory cell. The asymmetric-area memory cell 100 comprises a bottom electrode 102 (BE) having an area 104. A colossal magnetoresistance (CMR) memory film 106 overlies the bottom electrode 102, having an asymmetric area 108. A top electrode 110 (TE) has an area 112, less than the bottom electrode area 104, overlying the CMR film 106. More specifically, the CMR film 106 has a first area 114 adjacent the top electrode 110 and a second area 116, greater than the first area 114, adjacent the bottom electrode 102. Typically, the CMR memory film 106 is formed from $Pr_{0.3}Ca_{0.7}MnO_3$ (PCMO). However, other materials are also known in the art such as high temperature super conducting (HTSC), and perovskite metal oxide materials.

Figure 3:
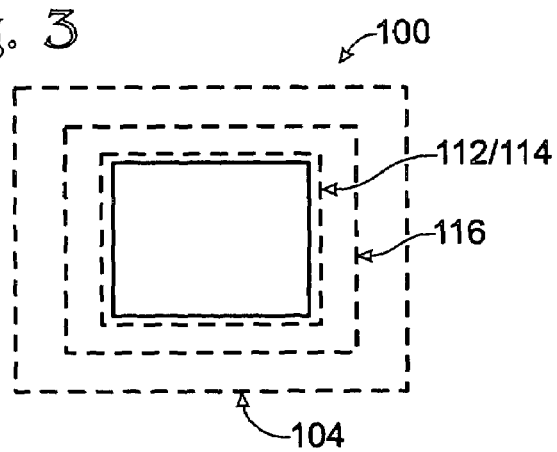
FIG. 3 is a plan view of the asymmetric-area memory cell of FIG. 2.

FIG. 3 is a plan view of the asymmetric-area memory cell of FIG. 2. As used herein, the word "area" is understood to be a cross-sectional region when viewed from the perspective of FIG. 2. The areas 104, 110, and 116 are shown in phantom (dotted lines) to illustrate the relative area sizes. As can be seen, the CMR film first area 114 is approximately equal to the top electrode area 112. The term "approximately" is used to account for typical tolerances in the fabrication process. As explained below, area 114 may be slightly larger that area 112, due to the fact that the top electrode 110 is exposed to etchant for a greater period of time. However, in other aspects, area 112 may be slightly larger that area 114, in response to the etch selectivity of the CMR and electrode materials.

The CMR second area 116 is shown as less than the bottom electrode area 104, as explained in more detail below. However, in other aspects, the CMR second area 116 and the bottom electrode area 104 can be the same. Although the areas 104, 110, 114, and 116 are shown as approximately square in shape, in other aspects the areas may be rectangular, circular, or oval in shape.

Returning to FIG. 2, the CMR memory film 106 has an overall first thickness 120, a second thickness portion 122 with the first area 114, and a third thickness portion 124 with the second area 116 underlying the second thickness portion 122. The third thickness 124 is equal to the first thickness 120 minus the second thickness 122. The CMR film third thickness 124 is in the range of 20 to 80% of the first thickness 120. The first thickness 120 is in the range of 50 to 350 nanometers (nm).

Although the second and third thickness portions 122/124 are shown as stepped, or rectangular in shape, the invention is not limited to any particular shape. In other aspect (not shown), the CMR film asymmetric area 108 has a cone shape, with a linear change in area from the first area 114 to the second area 116. In another aspect (not shown), the asymmetric area 108 has a stepped pyramid shape. Other asymmetric shapes are also possible.

A first set of sidewall insulators 130a and 130b is adjacent the top electrode 110 and the second thickness portion 122 of the CMR film 106. A second set of sidewall insulators 132a and 132b overlies the first set of sidewall insulators 130a and 130b and is adjacent the third thickness portion 124 of the CMR film 106.

The first set of sidewall insulators 130a and 130b is formed from a material such as silicon nitride or aluminum oxide. However, other insulator materials are known in the art. Each sidewall (130a or 130b) has a thickness 134 in the range of 50 to 200 nm. Likewise, the second set of sidewall insulators 132a and 132b is formed from a material such as silicon nitride or aluminum oxide, with each sidewall having a thickness 136 in the range of 20 to 100 nm.

The bottom electrode 102 can be formed from a material such as TiN/Ti, Pt/TiN/Ti, In/TiN/Ti, PtRhOx compounds, or PtIrOx compounds. The top electrode 110 is formed from a material such as TiN, TiN/Pt, TiN/In, PtRhOx compounds, or PtIrOx compounds. However, this is not an exhaustive list of materials and other electrode materials are known in the art.

Figure 4:
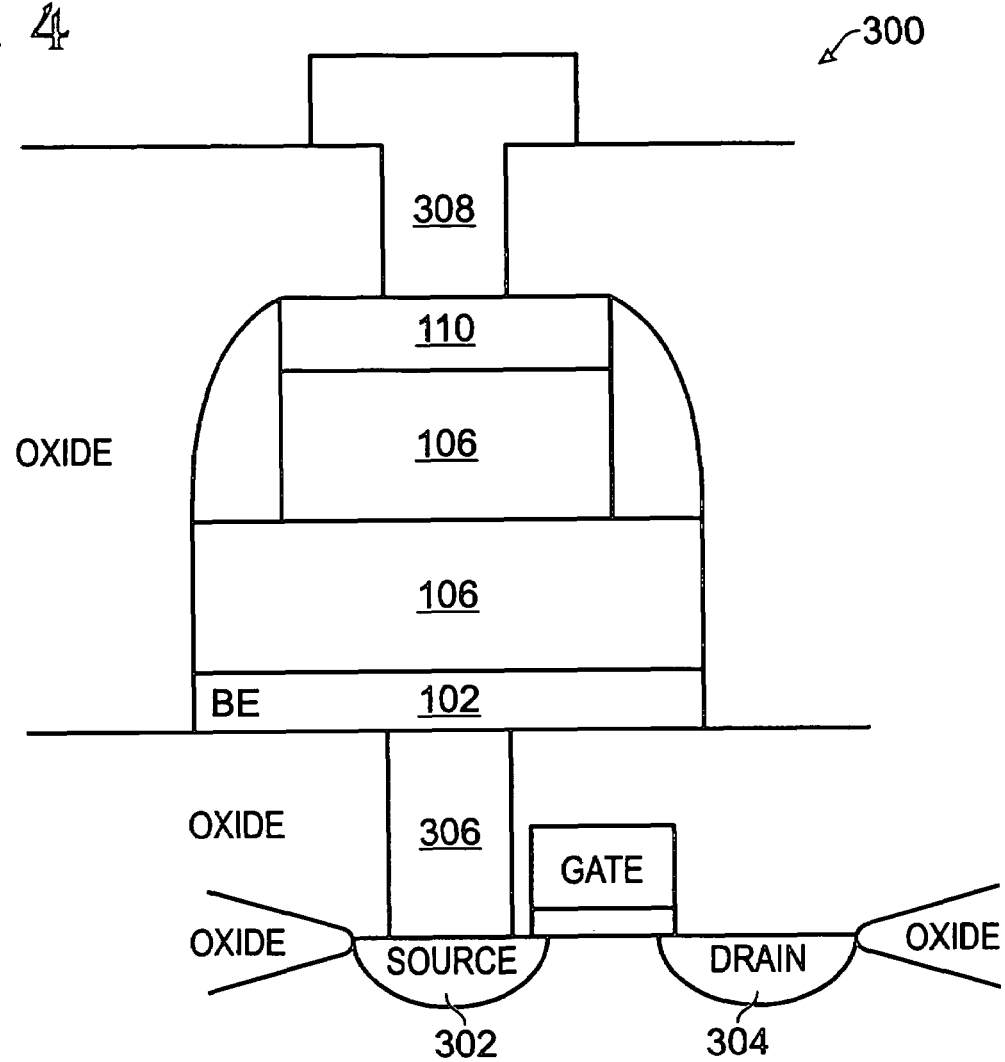
FIG. 4 is a diagram of the present invention RRAM asymmetric-area memory cell.

FIG. 4 is a diagram of the present invention RRAM asymmetric-area memory cell. The memory cell 300 comprises a CMOS transistor with source 302 and drain 304 active regions. The memory cell also includes a metal (or conductive material) interlevel interconnect 306 overlying a transistor active region. Although the interlevel interconnect 306 is shown connected to the source 302, alternately it could be connected to the drain 304. Bottom electrode 102, with area 104, overlies the interlevel interconnect 306. The bottom electrode 102 is in electrical communication with the interconnect 306. The CMR memory film 106 overlies the bottom electrode 102 and has an asymmetric area 108, as described in detail above (see FIGS. 2 and 3). The top electrode 110 has an area 112, less than the bottom electrode area 104, overlying the CMR film 106. In some aspects, a metal interlevel interconnect 308 overlies the memory cell top electrode 110.

FUNCTIONAL DESCRIPTION

Returning to FIG. 2, the CMR memory thin film is shown after etching. Two sets of nitride spacers (130a/b and 132a/b) are formed on the etched surface. The first sets of spacers 130a/b is used in the first etching process. The remaining CMR film is etched and passivated with a second nitride film. As a result, the top electrode area 112 is smaller than that of the bottom electrode area 104. The device 100 is asymmetric and can be programmed using either bipolar narrow pulses or uni-polar pulses.

Although the figure shows single metal electrodes, both top and bottom electrodes may also be made of multi-layer metals, such as TiN/Ti, Pt/TiN/Ti or In/TiN/Ti for bottom electrode, and TiN, TiN/Pt or TiN/In for the top electrode. As mentioned above, other combinations of materials are possible.

Figure 5:
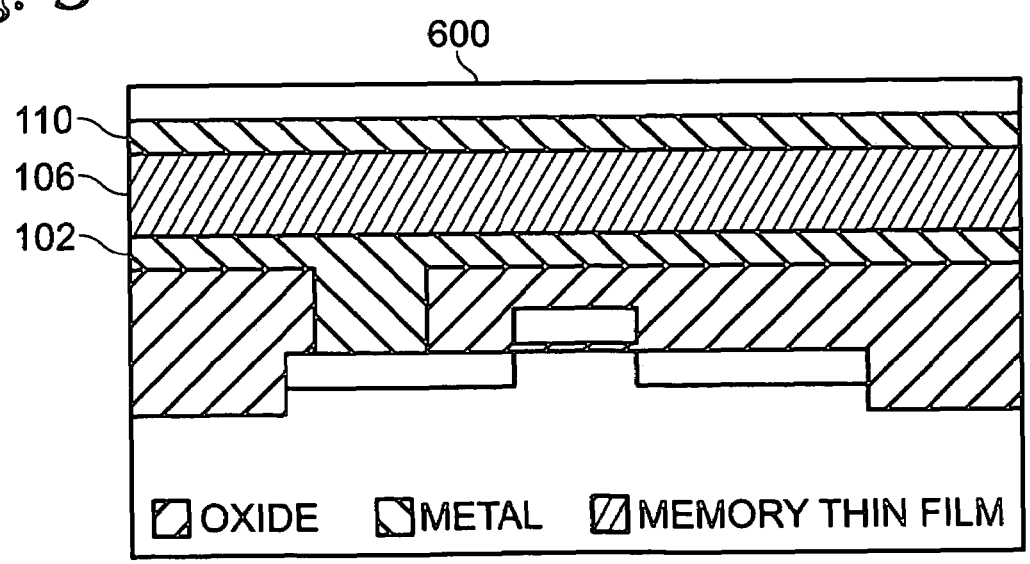
FIG. 5 illustrates an initial step in the present invention memory cell fabrication process.

FIG. 5 illustrates an initial step in the present invention memory cell fabrication process. After complete fabrication of all electronics (transistor elements) onto a silicon substrate, the wafer is passivated with oxide. A metal interconnect for the memory cell and the associated transistor is formed and planarized using any state-of-the-art means, such as chemical-mechanical polishing (CMP) process. A stack including the bottom electrode 102, memory resistor thin film 106, top electrode 110, and a hard mask material 600 is formed.

Figure 6A:
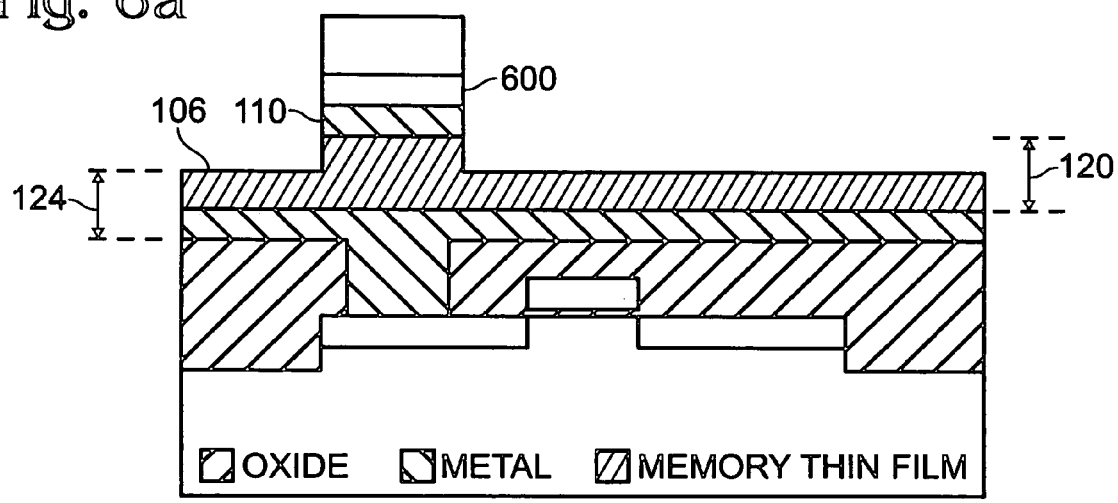
FIGS. 6a through 6d illustrate additional steps in the fabrication of an RRAM memory cell using the asymmetric-area CMR film.

FIGS. 6a through 6d illustrate additional steps in the fabrication of an RRAM memory cell using the asymmetric-area CMR film. In FIG. 6a photoresist is used to etch hard mask 600, top electrode 110, and memory resistor thin film 106. The memory resistor thin film 106 is partially etched. The remaining memory film (third thickness portion 124) is 20% to 80% of the original film thickness 120.

Figure 6B:
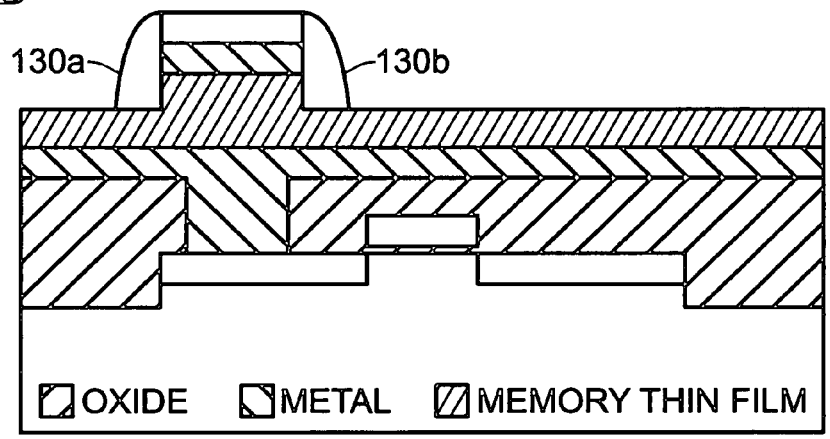

In FIG. 6b the photoresist is stripped. From 50 nm to 200 nm of silicon nitride is deposited. The silicon nitride is etched to form passivated etched memory resistor thin film sidewalls (130a and 130b).

Figure 6C:
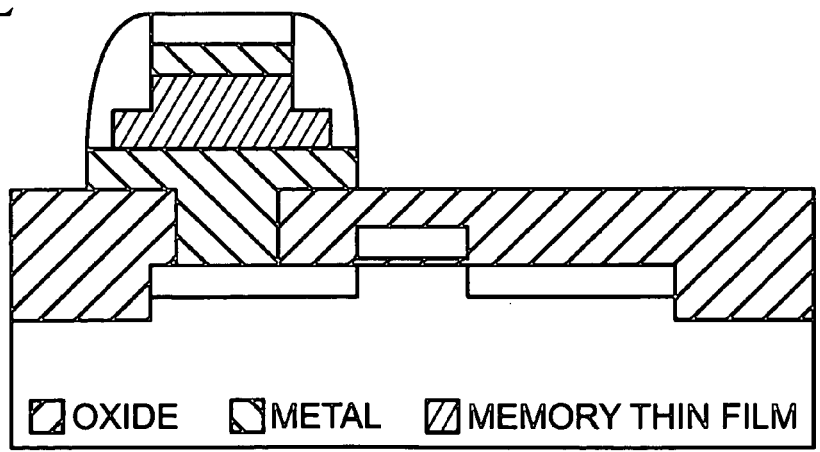

In FIG. 6c the remaining memory resistor thin film is etched. First, a second silicon nitride is deposited, 20 nm to 100 nm thick. Then, the bottom electrode is etched.

Figure 6D:
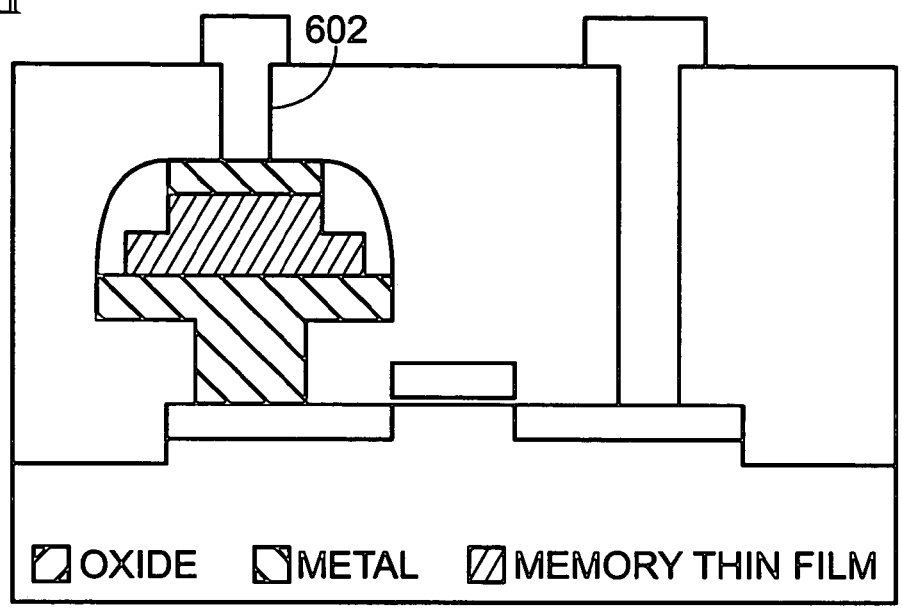

The hard mask may be removed in either the processes of FIG. 6b or FIG. 6c. In FIG. 6d oxide is deposited. Optionally, a CMP planarization process can be performed, and then another metal interconnect 602 is formed.

In some aspects, a refractory metal is used as part of the bottom electrode. The refractory metal is dry etched, at least partially, using a sputtering process. In a conventional memory cell process it would be likely that some of the refractory metal removed from the bottom electrode would be re-deposited on the sidewalls of the memory resistor stack, degrading memory resistor properties. However, the present invention memory cell sidewall insulators protect against refractory metal re-deposition, improving the process yield.

Figure 7:
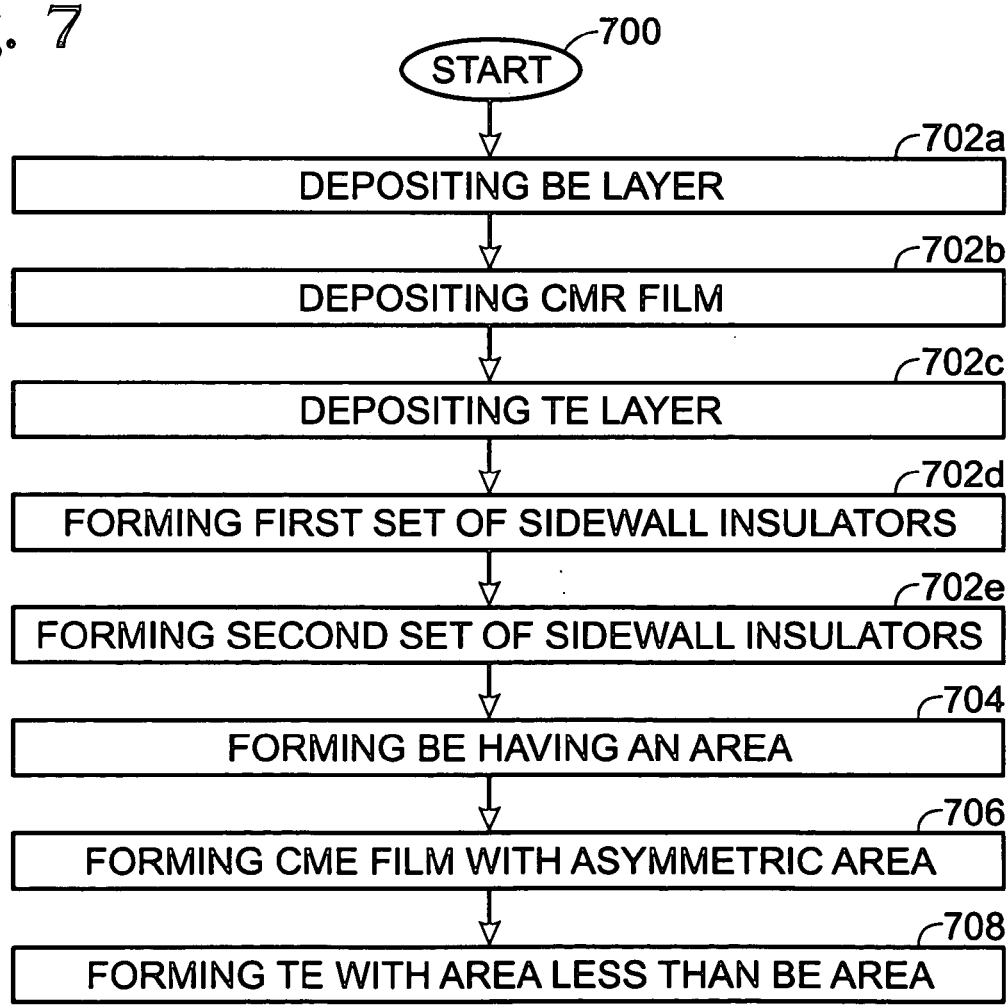
FIG. 7 is a flowchart illustrating the present invention method for forming an asymmetric-area memory cell.

FIG. 7 is a flowchart illustrating the present invention method for forming an asymmetric-area memory cell. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 704 forms a bottom electrode having an area, see FIG. 3 for the definition of "area". In some aspects the bottom electrode is formed from a material such as TiN/Ti, Pt/TiN/Ti, In/TiN/Ti, PtRhOx compounds, or PtIrOx compounds. Step 706 forms a CMR memory film overlying the bottom electrode, having an asymmetric area. The CMR memory film can be formed from a $Pr_{0.3}Ca_{0.7}MnO_3$ (PCMO) memory film. Step 708 forms a top electrode having an area, less than the bottom electrode area, overlying the CMR film. The top electrode can be formed from TiN, TiN/Pt, TiN/In, PtRhOx, or PtIrOx compounds.

Forming a CMR film with an asymmetric area (Step 706) includes forming a CMR film with a first area adjacent the top electrode and a second area, greater than the first area, adjacent the bottom electrode. In some aspects of the method, the CMR film first area is approximately equal to the top electrode area. In other aspects, the CMR film second area is less than the bottom electrode area.

More specifically, the method may comprise additional steps. Step 702a isotropically deposits a bottom electrode (BE) layer. Step 702b isotropically depositing a CMR film layer, having a first thickness, overlying the bottom electrode layer. Step 702c isotropically deposits a top electrode (TE) layer overlying the CMR film layer. Then, forming the top electrode area (Step 708) and the CMR film first area (Step 706) includes etching the top electrode layer and a second thickness portion of the CMR film layer.

Step 702d forms a first set of sidewall insulators adjacent the top electrode and the second thickness portion of the CMR film. In some aspects the sidewall insulators are formed from a material such as silicon nitride or aluminum oxide, having a thickness in the range of 50 to 200 nm. Then, forming a CMR film second area (Step 706) includes etching the remaining portion of the CMR film layer, leaving a third thickness portion of the CMR film second area underlying the first set of sidewall insulators, where the third thickness is equal to the first thickness minus the second thickness. In some aspects the CMR third thickness is in the range of 20 to 80% of the first thickness. In other aspects, forming a CMR memory film (Step 706) includes forming a CMR film first thickness in the range of 50 to 350 nanometers.

Step 702e forms a second set of sidewall insulators overlaying the first set of sidewall insulators and adjacent the third thickness portion of the CMR film. In some aspects the second set of sidewall insulators are formed from a silicon nitride or aluminum oxide material, having a thickness in the range of 20 to 100 nm. Then, forming a bottom electrode having an area (Step 704) includes etching the bottom electrode layer, leaving a bottom electrode area underlying the first and second set of sidewall insulators.

FIG. 8 is a flowchart illustrating the present invention method for forming an RRAM asymmetric-area memory cell. The method starts at Step 800. Step 802 forms a CMOS transistor with source and drain active regions. Step 804 forms a metal interlevel interconnect to a transistor active region (either the source or drain). Steps 802 and 804 can be performed using conventional processes known in the art. Step 806 forms a bottom electrode having an area overlying the interlevel interconnect. Step 808 forms a CMR memory film overlying the bottom electrode, having an asymmetric area. Step 810 forms a top electrode having an area, less than the bottom electrode area, overlying the CMR film. Steps 806, 808, and 810 are described in more detail in the explanation of FIG. 7.

FIG. 9 is a flowchart illustrating the present invention method for programming an asymmetric-area memory cell using bipolar and uni-polar pulses. The method starts at Step 900. Step 902 applies a first voltage pulse with a first polarity to a memory cell top electrode. As described below, the first pulse is relatively narrow. Step 904, in response to the first pulse, creates a low resistance in an asymmetrical-area colossal magnetoresistance (CMR) memory film. Step 906 applies a second (narrow) voltage pulse with a second polarity, opposite of the first polarity, to the memory cell top electrode. Step 908, in response to the second pulse, creates a high resistance in the asymmetric-area CMR memory film. Step 910 applies a third pulse, having the same polarity as the second pulse, and a pulse width of greater than 1 microsecond. Step 912, in response to the third pulse, creates a low resistance in the CMR memory film.

Creating a low resistance in the CMR memory film in response to the first pulse (Step 904) includes creating a low resistance in a narrow-area region of the asymmetric-area CMR memory film. In some aspects, the low resistance created in the CMR memory film is in the range of 1000 to 10 k ohms. Creating a high resistance in the CMR memory film (Step 908) includes creating a high resistance in the narrow area region of the asymmetric-area CMR memory film. The high resistance created in the CMR memory film is in the range of 100 k to 10 M ohms.

In some aspects applying a first pulse with a first polarity to the memory cell top electrode (Step 902) includes applying a voltage pulse with a width in the range of 5 to 500 nanoseconds (ns). Applying a second pulse with a second polarity to the memory cell top electrode (Step 906) includes applying a voltage pulse with a width in the range of 5 to 500 ns.

Assuming that the CMR film has a thickness in the range of 50 to 350 nanometers, Step 902 applies a first pulse with a voltage amplitude in the range of 2 to 6 volts, and Step 906 applies a second pulse with a voltage amplitude in the range of 2 to 6 volts.

In some aspects, creating a low resistance in a narrow-area region of the asymmetric-area CMR memory film in response to the first pulse (Step 904) includes creating a low resistance in response to a first electric field in the narrow-area region of the CMR memory film, and a second electric field, with a field intensity less than the first field, in a wide-area region of the CMR memory film. The first and second fields have the same polarity. Likewise, creating a high resistance in a narrow area region of the asymmetric-area CMR memory film (Step 908) includes creating a high resistance in response to a third electric field in the narrow-area region of the CMR memory film, opposite in polarity to the first field, and a fourth electric field, with a field intensity less than the third field, in a wide-area region of the CMR memory film. The third and fourth fields have the same polarity.

As an example, Step 902 applies a positive polarity pulse, and Step 904 creates a low resistance in a narrow-area region adjacent the top electrode. This example assumes that the memory cell is constructed as the memory cell depicted in FIG. 2. Continuing the example, Step 906 applies a negative polarity pulse. Then, creating a high resistance in a narrow-area region of the asymmetric-area CMR memory film (Step 908) includes creating a high resistance in a narrow-area region adjacent the top electrode. The pulse polarities mentioned in this example would be reversed if the top electrode, and the CMR film area adjacent the top electrode, were wider than the bottom electrode (the asymmetry was reversed).

An asymmetric-area memory cell, a corresponding RRAM structure, programming procedure, and fabrication process have been presented. Specific details, such as widths, thicknesses, and materials have been used to illustrate the invention. However, the invention is not limited to merely these examples. Other variations and embodiments of the invention will occur to those skilled in the art.

We claim:

1. An asymmetric-area memory cell comprising:
    a bottom electrode having an area;
    a colossal magnetoresistance (CMR) memory film overlying the bottom electrode, having an asymmetric area;
    a top electrode having an area, less than the bottom electrode area, overlying the CMR memory film; and,
    wherein the CMR memory film has a first area adjacent the top electrode and a second area, greater than the first area, adjacent the bottom electrode.

2. The memory cell of claim 1 wherein the CMR memory film first area is approximately equal to the top electrode area.

3. The memory cell of claim 2 wherein the CMR memory film second area is less than the bottom electrode area.

4. The memory cell of claim 3 wherein the CMR memory film has an overall first thickness, a second thickness portion of the CMR memory film with the first area, and a third thickness portion of the CMR memory film with the second area underlying the second thickness portion of the CMR memory film with the first area, where the third thickness of the CMR memory film with the second area is equal to the CMR memory film overall first thickness minus the second thickness portion of the CMR memory film with the first area.

5. The memory cell of claim 4 further comprising:
    a first set of sidewall insulators adjacent the top electrode and the second thickness portion of the CMR memory film with the first area; and,
    a second set of sidewall insulators overlaying the first set of sidewall insulators and adjacent the third thickness portion of the CMR memory film with the second area.

6. The memory cell of claim 5 wherein the third thickness portion of the CMR memory film with the second area is in the range of 20 to 80% of the CMR memory film overall first thickness.

7. The memory cell of claim 4 wherein the CMR memory film overall first thickness is in the range of 50 to 350 nanometers.

8. The memory cell of claim 5 wherein the first set of sidewall insulators is formed from a material selected from the group including silicon nitride and aluminum oxide, each sidewall having a thickness in the range of 50 to 200 nanometers (nm).

9. The memory cell of claim 8 wherein the second set of sidewall insulators is formed from a material selected from the group including silicon nitride and aluminum oxide, each sidewall having a thickness in the range of 20 to 100 nm.

10. The memory cell of claim 1 wherein the bottom electrode is formed from a material selected from the group including TiN/Ti, Pt/TiN/Ti, In/TiN/Ti, PtRhOx compounds, and PtIrOx compounds; and,
    wherein the top electrode is formed from a material selected from the group including TiN, TiN/Pt, TiN/In, PtRhOx compounds, and PtIrOx compounds.

11. The memory cell of claim 1 wherein the CMR memory film is formed from $Pr_{0.3}Ca_{0.7}MnO_3$ (PCMO).

12. An RRAM asymmetric-area memory cell comprising:
    a CMOS transistor with source and drain active regions;
    a metal interlevel interconnect overlying a transistor active region;
    a bottom electrode having an area, overlying the metal interlevel interconnect;
    a colossal magnetoresistance (CMR) memory film overlying the bottom electrode, having an asymmetric area;
    a top electrode having an area, less than the bottom electrode area, overlying the CMR memory film; and,
    wherein the CMR memory film has a first area adjacent the top electrode and a second area, greater than the first area, adjacent the bottom electrode.

* * * * *